(12) United States Patent
Kavousian

(10) Patent No.: US 10,476,468 B1
(45) Date of Patent: Nov. 12, 2019

(54) TUNING THIN-FILM BULK ACOUSTIC RESONATOR RADIO FREQUENCY RECEIVERS

(71) Applicant: Verily Life Sciences LLC, South San Francisco, CA (US)

(72) Inventor: Amirpouya Kavousian, San Jose, CA (US)

(73) Assignee: VERILY LIFE SCIENCES LLC, South San Francisco, CA (US)

(*) Notice: Subject to any disclaimer, the term of this patent is extended or adjusted under 35 U.S.C. 154(b) by 0 days.

(21) Appl. No.: 16/003,552

(22) Filed: Jun. 8, 2018

Related U.S. Application Data

(60) Provisional application No. 62/517,576, filed on Jun. 9, 2017.

(51) Int. Cl.
| | | |
|---|---|---|
| H04B 1/38 | (2015.01) | |
| H03H 9/02 | (2006.01) | |
| H04B 1/40 | (2015.01) | |
| H03H 9/17 | (2006.01) | |

(52) U.S. Cl.
CPC ........ *H03H 9/02007* (2013.01); *H03H 9/171* (2013.01); *H04B 1/40* (2013.01)

(58) Field of Classification Search
CPC ....... H03H 9/02007; H03H 9/171; H04B 1/40

USPC .......................................................... 375/219
See application file for complete search history.

(56) References Cited

U.S. PATENT DOCUMENTS

| | | | |
|---|---|---|---|
| 5,587,620 A | 12/1996 | Ruby et al. | |
| 6,262,637 B1 | 7/2001 | Bradley et al. | |
| 6,292,567 B1* | 9/2001 | Marland | H04N 7/1713 |
| | | | 348/E5.096 |
| 9,729,179 B1* | 8/2017 | Emadi | H04B 1/1027 |
| 2012/0302188 A1* | 11/2012 | Sahota | H04B 1/006 |
| | | | 455/150.1 |
| 2013/0278347 A1* | 10/2013 | Li | H03B 1/00 |
| | | | 331/36 R |
| 2016/0164481 A1* | 6/2016 | Madan | H03H 7/175 |
| | | | 333/174 |
| 2017/0063412 A1* | 3/2017 | Ripley | H04B 1/1036 |
| 2018/0069528 A1* | 3/2018 | Qiu | H03H 9/542 |

* cited by examiner

*Primary Examiner* — Dhaval V Patel
(74) *Attorney, Agent, or Firm* — Kilpatrick Townsend & Stockton LLP

(57) ABSTRACT

A device can include a thin-film bulk acoustic resonator ("FBAR"), a transceiver, a capacitor network, and a processor. The transceiver can transmit and receive radio frequency ("RF") signals using the FBAR. The capacitor network can be conductively coupled to the FBAR. The processor can be in communication with the capacitor network. The processor can obtain a capacitor tuning code. The processor can further establish a capacitance of the capacitor network based on the capacitor tuning code during a RF receiving operation.

22 Claims, 6 Drawing Sheets

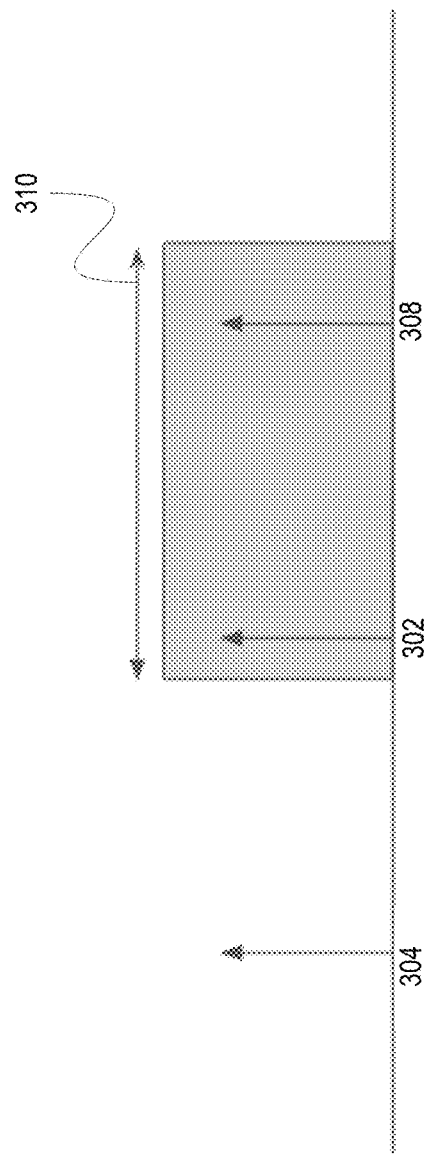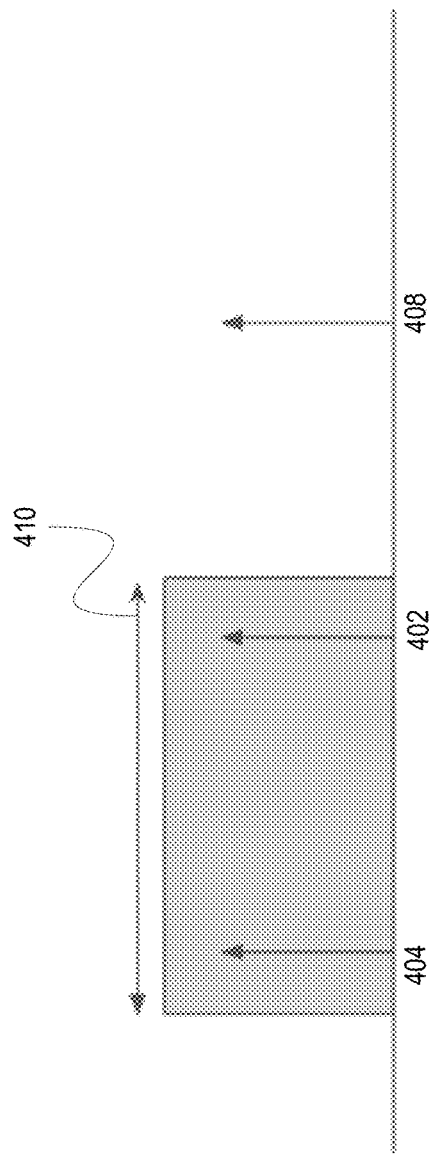

TUNING THIN-FILM BULK ACOUSTIC RESONATOR RADIO FREQUENCY RECEIVERS

CROSS-REFERENCE TO RELATED APPLICATIONS

The present application claims priority to Provisional Application No. 62/517,576, filed on Jun. 9, 2017, and entitled "Tuning Thin-Film Bulk Acoustic Resonator Radio Frequency Receivers," the entirety of which is hereby incorporated by reference herein.

TECHNICAL FIELD

The present disclosure relates generally to tuning radio frequency ("RF") receivers. More specifically, but not by way of limitation, this disclosure relates to tuning thin-film bulk acoustic resonator RF receivers.

BACKGROUND

Wireless devices employ transmitters and receivers to transmit and receive wireless signals. Each channel of these wireless signals are usually generated at a particular frequency, referred to as a "carrier frequency." The wireless signal generated at the carrier frequency may be referred to as a "carrier," and the carrier can be modulated to encode data. For example, the frequency of the carrier can be modulated to encode data onto the carrier. Such a technique is referred to as frequency modulation ("FM"). Other modulating techniques may be used in different applications.

SUMMARY

Various examples are described for tuning thin-film bulk acoustic resonator ("FBAR") radio frequency receivers. For example, one example device includes a thin-film bulk acoustic resonator ("FBAR"); a transceiver in communication with the FBAR and configured to transmit and receive RF signals using the FBAR; a capacitor network conductively coupled to the FBAR; and a processor in communication with the capacitor network, the processor configured to: obtain a capacitor tuning code; establish a capacitance of the capacitor network based on the capacitor tuning code during an RF receive operation; and receive wireless signals from the FBAR using the transceiver and the established capacitance of the capacitor network.

Another disclosed example device includes a wireless receiver comprising a thin-film bulk acoustic resonator ("FBAR"); a capacitor network conductively coupled to the FBAR, the capacitor network comprising a plurality of capacitors; a processor in communication with the capacitor network, the processor configured to: determine a natural frequency of the FBAR; determine a first capacitance based on the natural frequency of the FBAR and a transmit frequency, the first capacitance between a minimum capacitance and a maximum capacitance establishable by the capacitor network; determine a second capacitance based on a predetermined offset from the transmit frequency, a difference between the first capacitance and the minimum capacitance, and a difference between the first capacitance and the maximum capacitance; generate capacitor tuning code based on the first capacitance; and store the capacitor tuning code.

One disclosed example method includes receiving a capacitor tuning code from a memory device of a wireless device, the wireless device comprising a wireless receiver and a wireless transmitter, the wireless receiver comprising a thin-film bulk acoustic resonator ("FBAR"); establishing a capacitance of a capacitor network based on the capacitor tuning code, the capacitor network comprising a plurality of capacitors; coupling the capacitor network to the FBAR to apply the capacitance to the FBAR; and shifting, using the capacitor network, a frequency of an electrical signal received from the FBAR to a shifted frequency, the frequency of the electrical signal based on a wireless signal received by the FBAR and having substantially the same frequency used by the wireless transmitter Another disclosed example method includes providing a wireless receiver comprising thin-film bulk acoustic resonator ("FBAR"); conductively coupling a capacitor network to the FBAR; communicatively coupling a processor to the capacitor network; communicatively coupling a non-transitory computer-readable medium to the processor; and storing a capacitor tuning code based on a natural frequency of the FBAR in the non-transitory computer-readable medium.

Another disclosed example method includes determining a natural frequency of a thin-film bulk acoustic resonator ("FBAR") included in a wireless device, the wireless device comprising a wireless receiver and a wireless transmitter, the wireless receiver in communication with the FBAR; determining a first capacitance based on the natural frequency of the FBAR and a transmit frequency of the transmitter, the first capacitance between a minimum capacitance and a maximum capacitance; determining a second capacitance based on a predetermined offset from the transmit frequency, a difference between the first capacitance and the minimum capacitance, and a difference between the first capacitance and the maximum capacitance; generating a capacitor tuning code based on the second capacitance; and storing the capacitor tuning code.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples.

FIG. 3 is a graph of an example of a frequency range of an FBAR RF receiver tuned to high-side injection according to one aspect of the present disclosure.

FIG. 4 is a graph of an example of a frequency range of an FBAR RF receiver tuned to a low-side injection according to one aspect of the present disclosure.

DETAILED DESCRIPTION

Figure 1:
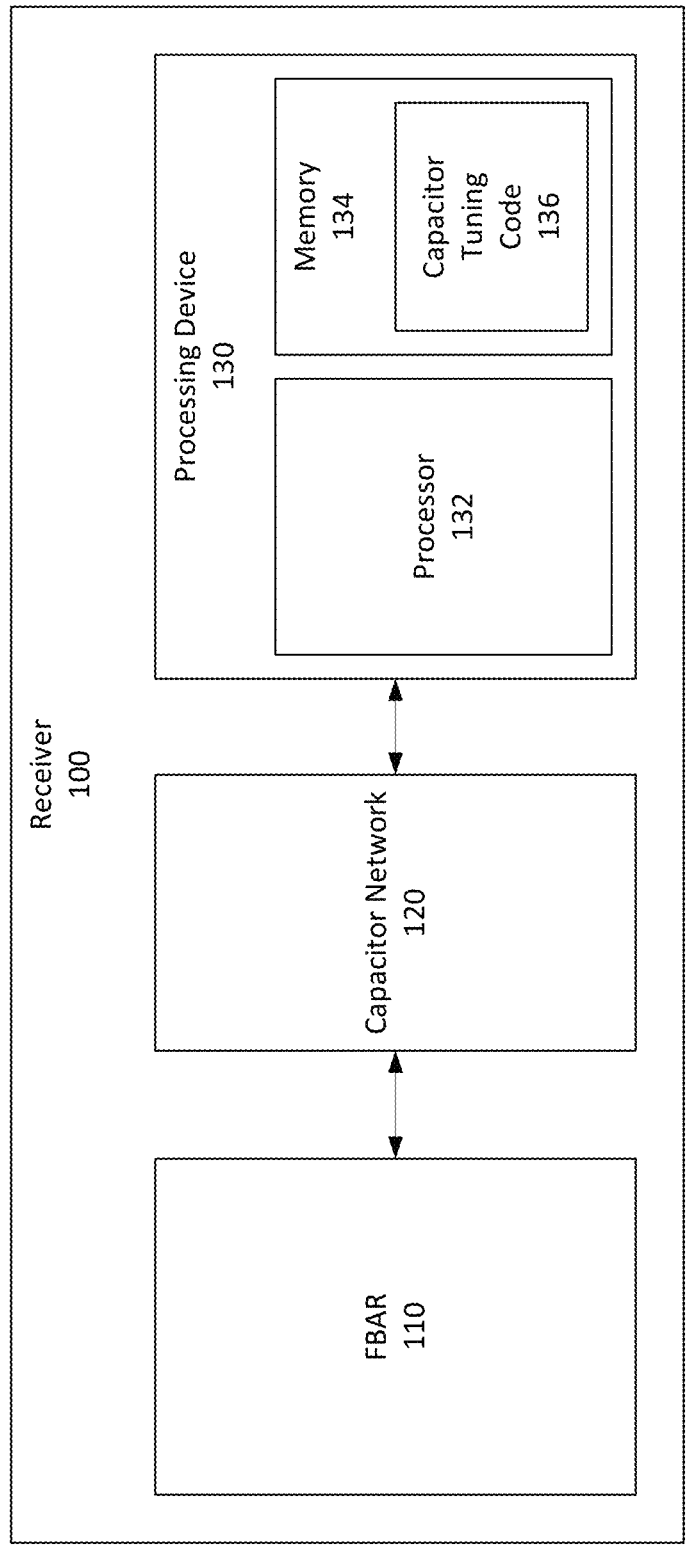
FIG. 1 is a block diagram of an example of a radio frequency ("RF") receiver with a thin-film bulk acoustic resonator ("FBAR") that is tunable to an offset from a transmitting frequency according to one aspect of the present disclosure.

Certain aspects and features relate to tuning thin-film bulk acoustic resonator ("FBAR") radio frequency ("RF") receivers. In one illustrative example, a wireless device employs a wireless transmitter and a wireless receiver to engage in two-way wireless communication with one or more other devices. To receive wireless signals, the wireless device employs an RF receiver having an FBAR, which includes a thin film piezoelectric material between two electrodes. The FBAR vibrates in response to received RF signals and outputs corresponding voltages. To transmit wireless signals, the wireless device employs an RF transmitter including the FBAR, which vibrates in response to an applied voltage to generate RF signals. However, any given FBAR may have only a narrow range of frequencies at which it can receive RF signals, which are generally centered around a natural frequency at which it most strongly resonates. To enable the wireless device to engage in full-duplex communication, i.e., to transmit data at the same time it is receiving data, the wireless device employs different carrier frequencies (e.g., channels) respectively to transmit and receive data using the FBAR. However, because the FBAR may have only a narrow range of frequencies at which it can oscillate, tuning the FBAR to receive RF signals at a frequency sufficiently different from a transmit frequency at which the FBAR transmits RF signals may be difficult.

In this example, however, the FBAR is coupled to a variable capacitor network that can be configured to apply a selected capacitance across the FBAR, thereby adjusting the carrier frequency at which the FBAR will receive RF signals. However, to ensure that the FBAR is tunable to a desired carrier frequency that is within the FBAR's narrow frequency range, the FBAR's resonant frequency is first measured and recorded, such as by the manufacturer. After measuring the FBAR's resonant frequency, the capacitance of the variable capacitor network is then adjusted until the FBAR is tuned to receive RF signals having been transmitted at a carrier frequency and shifting a frequency of the received RF signals by a predetermined offset from the transmit frequency (e.g., a frequency used by the FBAR to transmit RF signals), thereby allowing the FBAR to receive signals at the same frequency at which it is also used to transmit. The capacitance needed to tune the FBAR to the transmit frequency is then compared to the maximum and minimum capacitances that may be supplied by, or to the mid-point of the capacitance range of, the variable capacitor network. If the selected capacitance is above the mid-point, or nearer the maximum available capacitance, the FBAR may be configured to a receive frequency higher than the transmit frequency by a pre-determined offset, e.g., 1-2 MHz. However, if the selected capacitance is below the mid-point, or nearer the minimum available capacitance, the FBAR may be configured to a receive frequency lower than the transmit frequency by the pre-determined offset. The variable capacitor network configuration to achieve the appropriate pre-determined offset frequency from the transmit frequency is then stored (e.g., digitally) as a "capacitor tuning code."

At a later time, when the wireless device begins to wirelessly communicate with a remote wireless device, the wireless device applies the determined capacitor tuning code to the variable capacitor network, thereby tuning the FBAR. The FBAR can be tuned to a frequency that is an offset from a receive frequency to enable either low-side or high-side injection based on an amount of offset that can be caused by the variable capacitor network. After tuning the FBAR to the appropriate frequency, the wireless device begins to wirelessly communicate with the remote wireless device.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 is a block diagram of an example of an RF receiver 100 with an FBAR 110 that is tunable to an offset from a transmitting frequency. The receiver 100 includes the FBAR 110, a variable capacitor network 120, and a processing device 130. In some aspects, the FBAR 110 is a filter in the RF receiver and prevents wireless signals with carrier frequencies outside of a narrow bandwidth (e.g., 1 MHz to 2 MHz wide) of carrier frequencies to be communicated through the FBAR 110. The variable capacitor network 120 is conductively coupled to the FBAR 110 for applying a capacitance to the FBAR 110. The amount of capacitance applied to the FBAR 110 affects the resonant frequency or the center of the narrow bandwidth of carrier frequencies. The amount of capacitance applied to the FBAR 110 is controllable by the processing device 130 by applying a capacitor tuning code to the variable capacitor network 120. In some examples, the processing device 130 determines a capacitance for shifting the resonant frequency of the FBAR 110 to be a predetermined offset from a selected transmit frequency. In some examples, the processing device 130 can include any number of processors 132 to executing program code stored in memory 134. Examples of the processing device 130 include a microprocessor, an application-specific integrated circuit ("ASIC"), a field-programmable gate array ("FPGA"), or another suitable processor. In some examples, the processing device 130 is a dedicated processing device used for tuning the FBAR 110 by adjusting the capacitance of the variable capacitor network 120. In additional or alternative examples, the processing device 130 processes signals received by the receiver 100.

The processing device 130 can include (or be communicatively coupled with) the memory 134. The memory 134 can include one or more memory devices that can store program instructions. The program instructions can include for example, capacitor tuning code 136 that is executable by the processing device 130 to perform certain operations described herein.

The operations performed by the processor 132 can include tuning the FBAR 110 using the capacitor tuning code 136. To do so, the processing device 130 obtains the capacitor tuning code 136 and applies it to the variable capacitor network 120. The processing device 130 may retrieve the capacitor tuning code 136 from the memory 134 or determine the capacitor tuning code 136 in substantially real time. The variable capacitor network 120 establishes a capacitance based on the capacitor tuning code 136. In some aspects, the variable capacitor network 120 establishes the capacitance based on instructions from the processing device 130. For example, the processing device 130 may instruct the variable capacitor network 120 to activate one or more capacitors or groups of capacitors to couple the capacitance to the FBAR 110. In some examples, coupling the capacitance to the FBAR 110 shifts the resonant frequency of the FBAR 110 allowing the receiver 100 to receive wireless signals via the FBAR 110 as part of a Bluetooth network.

The operations performed by the processor 132 can further include generating and storing the capacitor tuning code 136. In some examples, the processing device 130 determines a first capacitance based on a natural frequency of the FBAR 110 and a predetermined transmit frequency. To do so, the processing device 130 adjusts the carrier frequency of the FBAR 110 by instructing the capacitor network to incrementally adjust an amount of capacitance applied to the FBAR 110. Once the carrier frequency of the FBAR 110 is tuned to match the predetermined transmit frequency, the processing device determines the first capacitance based on the capacitance applied to the FBAR 110.

After determining the first capacitance, the processing device 130 determines a second capacitance based on a predetermined offset from the transmit frequency, a difference between the first capacitance and the minimum capacitance, and a difference between the first capacitance and the maximum capacitance. To do so, the processing device 130 determines where, within the range of capacitance available from the variable capacitor network 120, the first capacitance lies. If the first capacitance is closer to the maximum available capacitance than the minimum available capacitance, e.g., above the mid-point capacitance of the variable capacitor network 120, the processing device 130 determines that the FBAR 110 may be more easily tuned to carrier frequencies below the transmit frequency. Or, if the reverse is true, the processor 132 determines that the FBAR 110 may be more easily tuned to carrier frequencies above the transmit frequency. Based on this determination, the processing device 130 then determines an amount of capacitance needed to tune the FBAR 110 to a predetermined offset frequency above or below the transmit frequency. The determined amount of capacitance is then recorded as the capacitor tuning code 136.

The processing device 130 generates the capacitor tuning code 136 based on the second capacitance. The capacitor tuning code 136 may take any suitable format. For example, the capacitor tuning code 136 may be one or more numeric values or bitmasks that specifies which capacitors, or groups of capacitors, within the variable capacitor network 120 are enabled or disabled. In some examples, the capacitor tuning code 136 may include instructions that are executed to enable one or more capacitors or capacitor networks. For example, the instructions may include a loop or sequence of statements that enable or disable individual capacitors or groups of capacitors based on the second capacitance. In some examples, as will be discussed below, the capacitor tuning code may physically adjust the position of a conductor to change a spacing between the conductors of a capacitor or an area of overlap between the two conductors.

Referring again to FIG. 1, in some examples, the FBAR 110 includes a piezoelectric material between 0.1 micrometer and 20 micrometers thick. The piezoelectric material in some examples can include aluminum nitride or zinc oxide or any other suitable material, while the electrodes of the FBAR 110 can include aluminum, platinum, tungsten, or any other suitable material.

In some examples, the variable capacitor network 120 includes a set of capacitors coupled in parallel such that the total capacitance of the variable capacitor network 120 is the sum of the set of capacitors. In some examples, the capacitors are coupled in parallel by switches such that the total capacitance of the variable capacitor network 120 is adjustable. Instructions received by the variable capacitor network 120 or directly by the switches cause the switches to open and close such that the total capacitance of the variable capacitor network 120 changes. In additional or alternative aspects, the capacitors are digitally-controlled capacitors and the capacitance of the capacitors can be controlled by the processing device 130. In some examples, one or more capacitors may be adjusted by varying the size of one or more conductors or a gap between the conductors.

In some examples, the non-transitory computer-readable medium 134 can be communicatively coupled to (or included in) secondary, tertiary, or auxiliary storage such as large hard drives, servers, virtual memory, among other types. Storage devices may include portable or non-portable storage devices, optical storage devices, and various other mediums capable of storing or containing data. The non-transitory computer-readable medium 134 can include any electronic, optical, magnetic, or other storage device capable of providing the processor 132 with computer-readable program code or other program code. Non-limiting examples of the non-transitory computer-readable medium 134 include a magnetic disk, memory chip, optical storage, flash memory, storage class memory, a CD-ROM, DVD, ROM, RAM, an ASIC, magnetic tape or other magnetic storage, or any other medium from which the processor 132 can read and execute program code. The program code may include processor-specific program code generated by a compiler or an interpreter from code written in any suitable computer-programming language. Examples of suitable programming language include C, C++, C#, Visual Basic, Java, Python, Perl, JavaScript, ActionScript, etc.

Although FIG. 1 depicts the RF receiver 100 as an independent device, the RF receiver can be part of a RF transceiver that further includes a RF transmitter. In some examples, the FBAR 110 is shared by the RF receiver 100 and the RF transmitter. The RF transmitter can use the FBAR 110 as an oscillator for generating a RF signal at a transmit carrier frequency to transmit data. In additional or alternative examples, the capacitor network 120 and the processing device 130 is shared by the RF receiver 100 and the RF transmitter, or a separate capacitor network may be used for each of the transmit and receive functionality of the RF transceiver. The processing device 130 can execute the capacitor tuning code 136 to cause a capacitance to be applied to the FBAR 110 by the variable capacitor network 120 during a RF receive operation. The processing device 130 can also execute another set of capacitor tuning code to cause another capacitance to be applied to the FBAR 110 by the variable capacitor network 120 during a RF transmit operation. In some examples, the processing device 130 determines the capacitor tuning codes such that the resonant receive frequency of the FBAR 110 is a predetermined offset from a resonant frequency of the FBAR 110.

Figure 2:
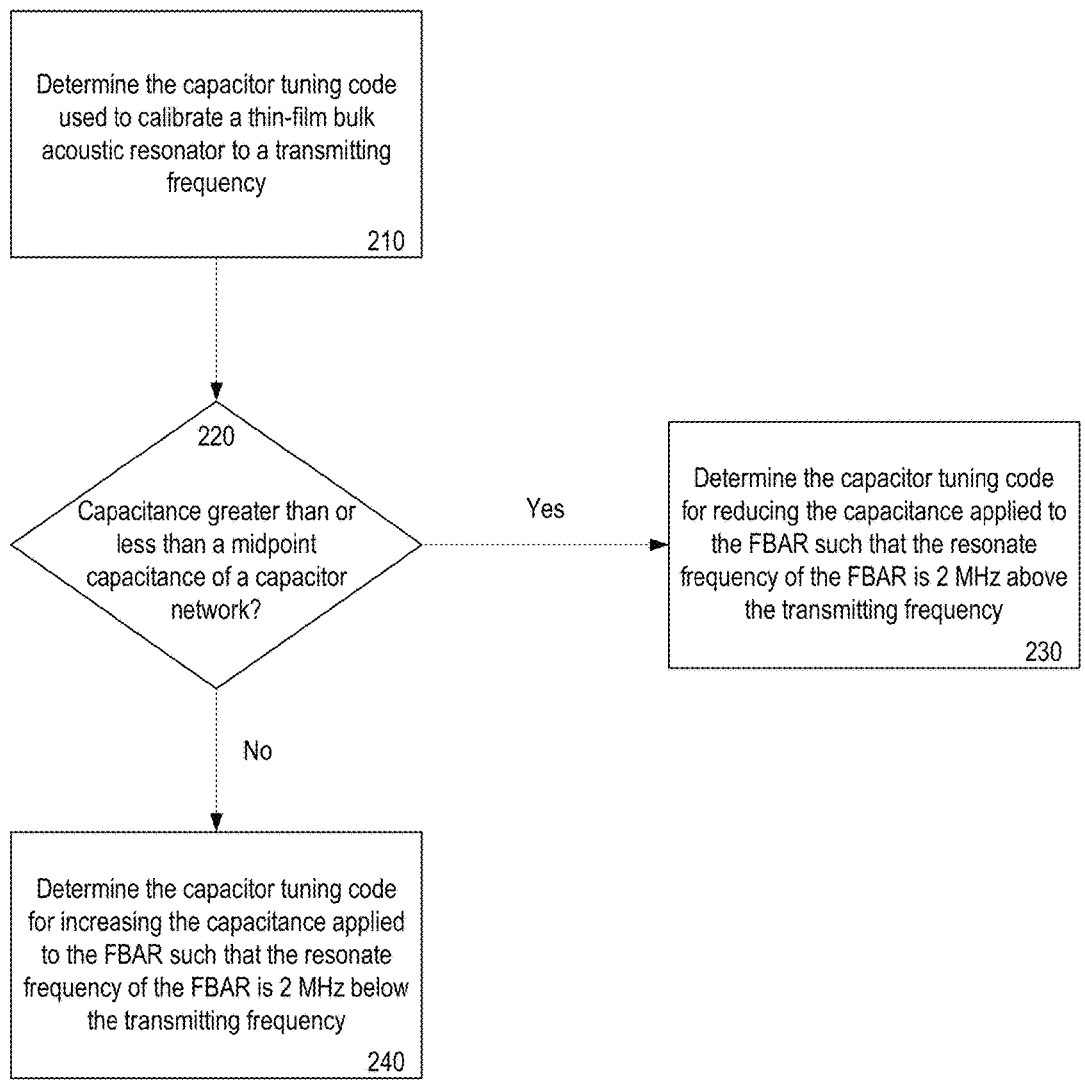
FIG. 2 is a flow chart of an example of a process for determining a capacitor tuning code for tuning an FBAR RF receiver to an offset of from a transmitting frequency according to one aspect of the present disclosure.

FIG. 2 is a flow chart of an example of a process for generating capacitor tuning code for tuning an FBAR RF receiver to an offset plus or minus 2 MHz from a transmitting frequency. In some examples, a 2 MHz offset is used between a transmitting frequency and a receiving frequency in Bluetooth communication to reduce interference. The description of FIG. 2 will be made with respect to the circuit shown in FIG. 1; however, it should be appreciated that any suitable circuit according to this disclosure may be employed.

In block 210, the processing device 130 determines a transmitting capacitor tuning code used to calibrate the FBAR 110 to a selected transmitting frequency. In some examples, the transmitting capacitor tuning code is determined during manufacturing and stored in the memory 134. In additional or alternative examples, the processing device 130 determines the transmitting tuning code by determining a change in capacitance needed to shift the natural frequency of the FBAR 110 to the transmitting frequency. To determine the needed change in capacitance, the processor 132 incrementally adjusts the capacitance provided by the variable capacitor network 120 and determines the carrier frequency of the FBAR 110 until the selected transmit frequency is reached.

In block 220, the processing device 130 determines if the capacitance produced by the transmitting capacitor tuning code is greater than or less than the midpoint capacitance of the variable capacitor network 120. If the capacitance is greater than the midpoint capacitance, the processing device 130 performs the actions in block 230. Otherwise, the processing device 130 performs the actions in block 240.

In block 230, the processing device 130 determines the capacitor tuning code 136 that reduces the capacitance applied to the FBAR 110 such that the resonant frequency of the FBAR 110 is 2 MHz above the transmitting frequency. The amount of capacitance to apply to the FBAR 110 to increase the resonant frequency by 2 MHz may be calculated or may be determined based on incrementally adjusting the capacitance applied to the FBAR 110 by the variable capacitor network 120. When the receive frequency is above the transmit frequency, the receiver 100 is operating in a high-side injection mode. In some examples, the receiver 100 operates in a high-side injection mode by offsetting received RF signals to a carrier frequency 2 MHz above the transmit frequency. Operating in the high-side injection mode reduces attenuation of the received signals by filtering out signals with a carrier frequency 2 MHz below the transmit frequency.

In block 240, the processing device 130 determines the capacitor tuning code 136 that increases the capacitance applied to the FBAR 110 such that the resonant frequency of the FBAR 110 is 2 MHz below the transmitting frequency. The amount of capacitance to apply to the FBAR 110 to reduce the resonant frequency by 2 MHz may be calculated or may be determined based on incrementally adjusting the capacitance applied to the FBAR 110 by the variable capacitor network 120. When the receive frequency is below the transmit frequency, the receiver 100 is operating in a low-side injection mode. In some examples, the receiver 100 operates in a low-side injection mode by offsetting received RF signals to a carrier frequency 2 MHz below the transmit frequency. Operating in the low-side injection mode reduces attenuation of the received signals by filtering out signals with a carrier frequency 2 MHz above the transmit frequency. FIG. 3 is a graph of an example of a tunable frequency range 310 for tuning an FBAR RF receiver. The graph illustrates a transmit frequency 302, two candidate receive frequencies 304, 308 that are offset by approximate 2 MHz from the transmit frequency 302, and the tunable frequency range 310 of the FBAR. As can be seen, the transmit frequency 302 is closer to a minimum frequency of the tunable frequency range 310 of the FBAR than a maximum frequency of the tunable frequency range 310. Further, only one candidate receive frequency 308 falls within the tunable frequency range 310 of the FBAR. Thus, in this example, the process of FIG. 2 would determine that, based on the capacitance required to tune the FBAR to the transmit frequency, a high-side injection mode is appropriate, as discussed above.

FIG. 4 is a graph of an example of a tunable frequency range 410 for tuning an FBAR RF receiver. The graph illustrates a transmit frequency 402, two candidate receive frequencies 404, 404 that are offset by approximately 2 MHz from the transmit frequency 402, and tunable frequency range 410 of the FBAR. As can be seen, the transmit frequency 402 is closer to a maximum of the tunable frequency range 410 of the FBAR than a minimum frequency of the tunable frequency range 410. Further, only one candidate receive frequency 404 falls within the tunable frequency range 410 of the FBAR. Thus, in this example, the process of FIG. 2 would determine that, based on the capacitance required to tune the FBAR to the transmit frequency, a low-side injection mode is appropriate, as discussed above.

Figure 5:
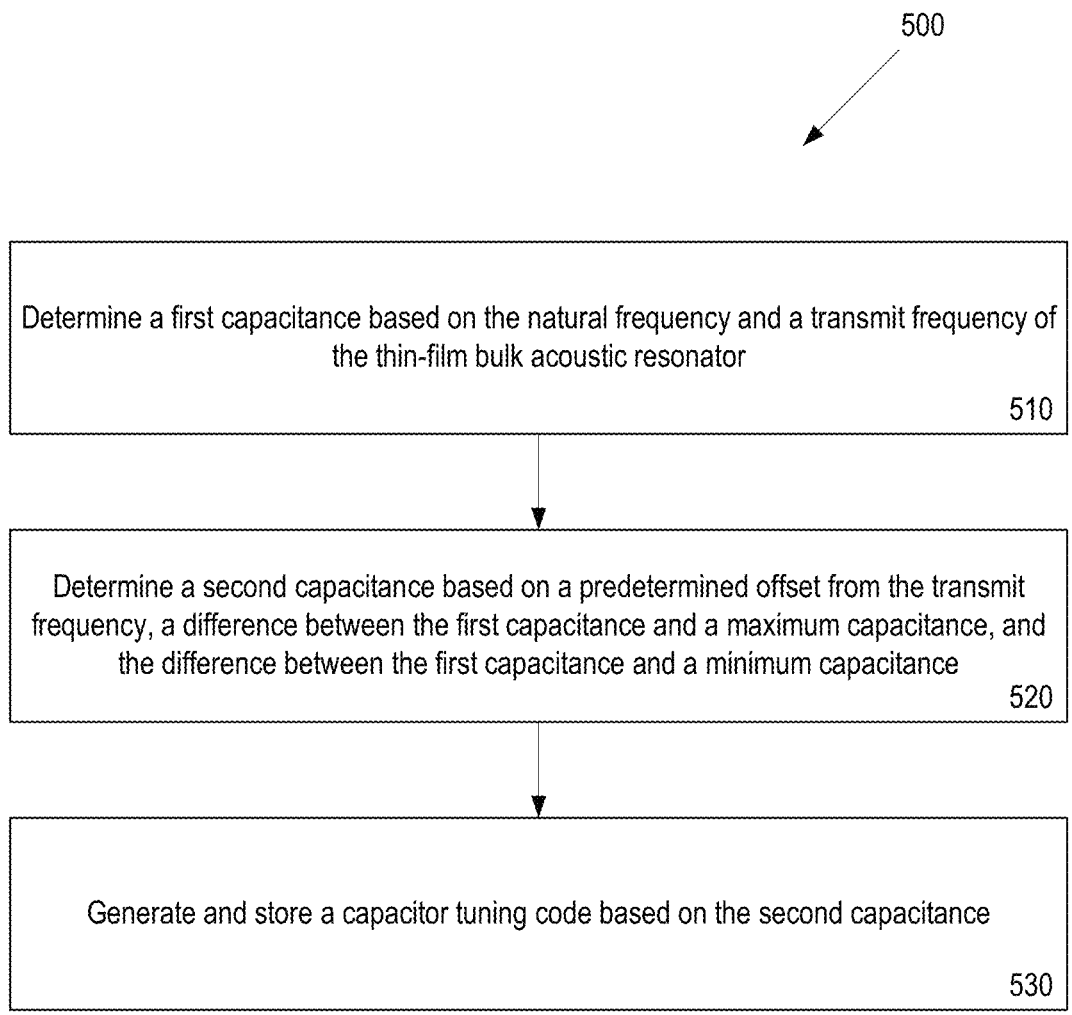
FIG. 5 is a flow chart of an example of a process for storing a capacitor tuning code to memory for tuning an FBAR to an offset from a transmitting frequency according to one aspect of the present disclosure.

FIG. 5 is a flow chart of an example of a process 500 for generating and storing a capacitor tuning code to memory for tuning an FBAR to an offset from a transmitting frequency. In some aspects, the process 500 tunes the FBAR for use with low-intermediate frequency architectures. The description of FIG. 5 will be made with respect to the circuit shown in FIG. 1; however, it should be appreciated that any suitable circuit according to this disclosure may be employed.

In block 510, the processing device 130 determines a first capacitance based on a natural frequency of the FBAR 110 and a transmit frequency of the FBAR 110. The first capacitance is between a minimum capacitance and a maximum capacitance available from the variable capacitor network 120. In some examples, the processing device 130 determines the first capacitance by adjusting a capacitance of the variable capacitor network 120 until a resonant frequency of the FBAR 110 is substantially equal to the transmit frequency, e.g., within approximately 40 parts-per-million ("ppm"). The transmit frequency is a predetermined frequency used by a wireless communications device, that includes the receiver 100, to transmit signals. In this example, the predetermined frequency is based on the wireless protocol (e.g., Bluetooth low-energy ("BLE")) used by the wireless communication device. The processing device 130 adjusts the capacitance of the variable capacitor network 120 by transmitting instructions to the variable capacitor network 120 indicating a set of capacitors in the variable capacitor network 120 to couple to the FBAR 110. Any suitable carrier frequency for wireless communications may be employed, such as approximately 2.4 gigahertz ("GHz") (e.g., between 2.4 and 2.485 GHz) for Bluetooth, BLE, or Zigbee. Other carrier frequencies may be used for other wireless communications, such as for WiFi or cellular.

In block 520, the processing device 130 determines a second capacitance based on a predetermined offset from the transmit frequency, a difference between the first capacitance and a minimum capacitance that can be generated by the variable capacitor network 120, and a difference between the first capacitance and the maximum capacitance that can be generated by the variable capacitor network 120. The processing device 130 determines the second capacitance such that the resonant frequency of the FBAR 110 is shifted by at least the predetermined offset from the transmit frequency in response to the variable capacitor network 120 applying the second capacitance to the FBAR 110.

As discussed above, based on where within the range of capacitance available from the variable capacitor network 120 the needed capacitance to achieve the transmit frequency lies, the processing device 130 can determine whether to use a high-side injection mode or a low-side injection mode. Thus, the processing device 130 may determine a mid-point capacitance value by subtracting the maximum available capacitance from the minimum available capacitance, and then determine whether the needed capacitance is above or below the midpoint. Or, the processing device 130 may determine differences between the needed capacitance and the maximum and minimum values and compare those two differences to determine which of the high-side or low-side injection mode should be employed. After determining the appropriate injection mode, the processing device 130 then selects the receive frequency based on the predetermined offset and the selected injection mode, and determines the second capacitance. For example, the processing device 130 may determine the second capacitance by iteratively adjusting the capacitance of the variable capacitor network 120 until the selected receive frequency is reached, e.g., within a tolerance of 40 ppm.

In block 530, the processing device 130 generates and stores the capacitor tuning code 136 based on the second capacitance. The capacitor tuning code 136 may take any suitable format. For example, the capacitor tuning code 136 may be one or more numeric values or bitmasks that specifies which capacitors, or groups of capacitors, within the variable capacitor network are enabled or disabled. In some examples, the capacitor tuning code 136 may include instructions that are executed to enable one or more capacitors or capacitor networks. For example, the instructions may include a loop or sequence of statements that enable or disable individual capacitors or groups of capacitors based on the second capacitance. In some examples, as will be discussed below, the capacitor tuning code may physically adjust the position of a conductor to change a spacing between the conductors of a capacitor or an area of overlap between the two conductors.

In some aspects, the capacitor tuning code includes instructions executable by the processing device 130 or the variable capacitor network 120 for setting a capacitance of the variable capacitor network 120 to be the second capacitance. The processing device 130 stores the instructions to the memory 134. At a later time, the instructions can be executed to cause the variable capacitor network 120 to apply the second capacitance to the FBAR 110 and shift the resonant frequency of the FBAR 110 to a target frequency. In additional or alternative aspects, the processing device 130 stores a value indicating the second capacitance to the memory 134. At a later time, the processing device 130 or another component can read the value and determine instructions for applying the second capacitance to the FBAR 110.

In additional or alternative aspects, the capacitor tuning code is a selection of capacitors in the variable capacitor network 120 to hardwire to the FBAR 110. For example, the processing device 130 determines a set of capacitors in the variable capacitor network 120 that are usable to apply the second capacitance to the FBAR 110. The processing device 130 stores the capacitor tuning code by hardwiring the capacitors to the FBAR 110 and preventing the other capacitors in the variable capacitor network 120 from being coupled to the FBAR 110 by blowing fuses or antifuses.

It should be appreciated that the blocks of the process 500 of FIG. 5 need not be performed in the order described, or that some blocks involve optional features, or that other blocks may be employed in addition to, or instead of, those described above.

Figure 6:
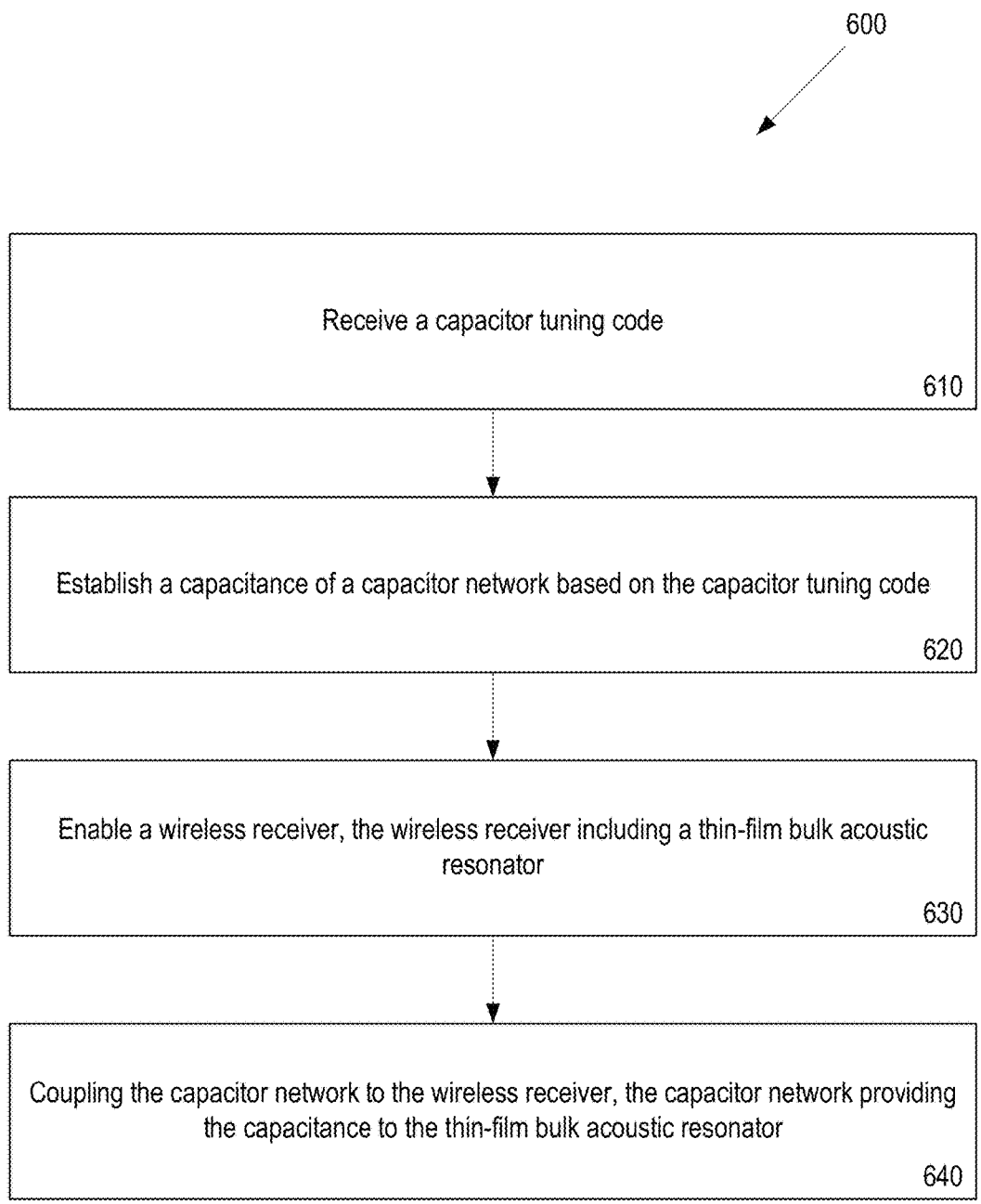
FIG. 6 is a flow chart of an example of a process for receiving RF signals using an FBAR RF receiver according to one aspect of the present disclosure.

FIG. 6 is a flow chart of an example of a process for receiving RF signals using an FBAR RF receiver. A tunable FBAR RF receiver can be tuned to an offset from a transmitting frequency, which can improve a signal quality of received signals. The description of FIG. 6 will be made with respect to the circuit shown in FIG. 1; however, it should be appreciated that any suitable circuit according to this disclosure may be employed.

In block 610, the processing device 130 receives the capacitor tuning code 136. In some examples, the processing device 130 retrieves the capacitor tuning code 136 from the memory 134. In additional or alternative examples, the processing device 130 receives the capacitor tuning code 136 from a computing device communicatively coupled to the receiver 100. The computing device can determine tuning codes for more than one FBAR produced in a batch. In some examples, the processor 132 executes capacitor tuning code instructions and applies tuning values, obtained as discussed above with respect to FIG. 5, using the instructions.

In block 620, the variable capacitor network 120 establishes a capacitance based on the capacitor tuning code 136. In some examples, the variable capacitor network 120 establishes the capacitance in response to the processing device 130 executing the capacitor tuning code 136. For example, the processing device 130 may control one or more switches conductively coupled in series with each capacitor and open and close one or more of the switches based on the capacitor tuning code 136. In additional or alternative examples, the variable capacitor network 120 is directly controlled by the capacitor tuning code 136. The capacitor tuning code includes a set of digital bits applied to a group of switches or other selectable components conductively coupled to the capacitors.

In block 630, the receiver 100, which includes the FBAR 110, is enabled. In some examples, the receiver 100 is a Bluetooth receiver for operating at carrier frequencies between 2402 MHz and 2480 MHz. The receiver 100 is enabled by receiving and demodulating the wireless signals that pass through the FBAR 110.

In block 640, the variable capacitor network 120 is coupled to the receiver 100 and provides the capacitance to the FBAR 110. As discussed above, the capacitance shifts the receive frequency of the FBAR 110.

It should be appreciated that the blocks of the process 600 of FIG. 6 need not be performed in the order described, or that some blocks involve optional features, or that other blocks may be employed in addition to, or instead of, those described above. In some examples, the receiver 100 is part of a transceiver that includes a transmitter. The receiver 100 and the transmitter share the FBAR 110 and the transmitter can be enabled for transmitting RF signals with a transmit frequency based on the FBAR 110. In additional or alternative examples, the processing device 130 receives an additional capacitor tuning code for use during a RF transmit operation. The variable capacitor network 120, or separate variable capacitor network, establishes another capacitance based on the additional capacitor tuning code and is coupled to the transmitter to provide the additional capacitance to the FBAR 110 for setting the transmit frequency.

Figure 7:
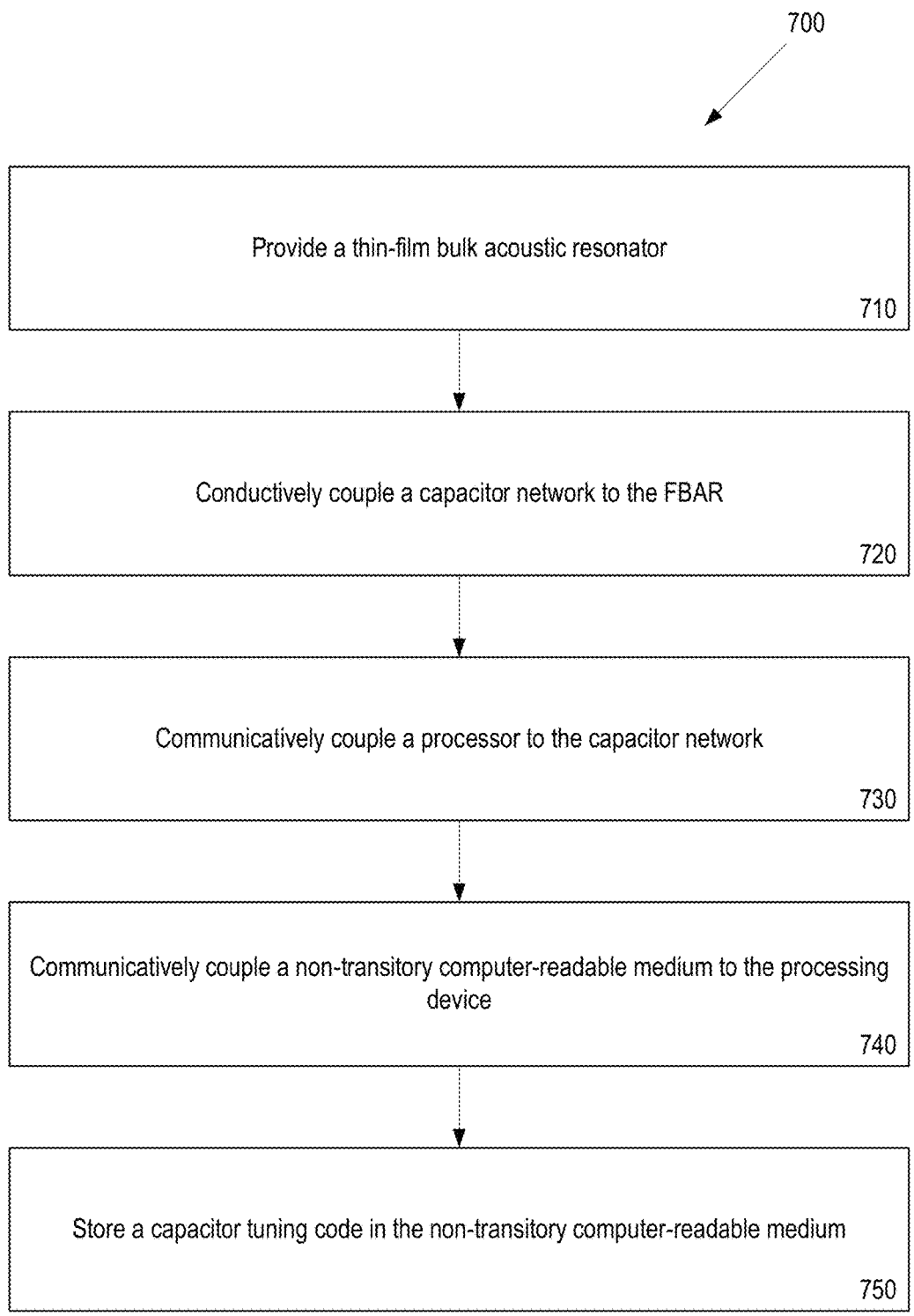
FIG. 7 is a flow chart of an example of a process for manufacturing an RF receiver with an FBAR that is tunable to an offset from a transmitting frequency according to one aspect of the present disclosure.

FIG. 7 is a flow chart of an example of a process for manufacturing an RF receiver with an FBAR that is tunable to an offset from a transmitting frequency. In some examples, the FBAR and the components for tuning the FBAR take up less area than a phase locked loop based receiver with a local oscillator.

In block 710, an FBAR is provided. In some examples, the FBAR is formed on a silicon wafer as part of a low-intermediate frequency RF receiver (e.g., a Bluetooth receiver) or as part of a package having multiple FBARs. In additional or alternative examples, the FBAR is provided as a discrete circuit component.

In block 720, a capacitor network is conductively coupled to the FBAR. In some examples, the capacitor network includes one or more capacitors conductively coupled in parallel with switches that control the total capacitance of the capacitor network. Conductively coupling the capacitor network to the FBAR includes conductively coupling one or more capacitors to the FBAR in parallel.

In block 730, a processor is communicatively coupled to the capacitor network. In some examples, the capacitor network and the processor are included in a processing device. In additional or alternative examples, the processor is communicatively coupled to each switch in the capacitor network for controlling the position of the switches.

In block 740, a non-transitory computer-readable medium is communicatively coupled to the processing device. In some examples, the non-transitory computer-readable medium is included in the processing device. In additional or alternative examples, the non-transitory computer-readable medium is independent from the processing device and communicatively coupled to the processing device by a bus or a wireless network.

In block 750, a capacitor tuning code is stored in the non-transitory computer-readable medium. In some examples, the capacitor tuning code is generated and stored generally as described in FIG. 5.

It should be appreciated that the blocks of the process 700 of FIG. 7 need not be performed in the order described, or that some blocks involve optional features, or that other blocks may be employed in addition to, or instead of, those described above.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A device comprising
 a thin-film bulk acoustic resonator ("FBAR");
 a receiver in communication with the FBAR and configured to receive RF signals using the FBAR;
 a capacitor network conductively coupled to the FBAR;
 a processor communicatively coupled to the capacitor network, the processor configured to:
  obtain a first capacitor tuning code to establish a first capacitance based on a natural frequency of the FBAR and a transmit frequency, the first capacitance between a minimum capacitance and a maximum capacitance establishable by the capacitor network;
  obtain a second capacitor tuning code, the second capacitor tuning code configured to establish a second capacitance of the capacitor network based on a predetermined offset from the transmit frequency, the second capacitance different than the first capacitance and between the minimum capacitance and the maximum capacitance establishable by the capacitor network;
  establish the second capacitance of the capacitor network based on the second capacitor tuning code during an RF receive operation; and
  receive wireless signals from the FBAR using the receiver and the established capacitance of the capacitor network.

2. The device of claim 1, further comprising a transmitter in communication with the FBAR and configured to transmit RF signals using the FBAR, wherein the processor is further configured to establish the first capacitance of the capacitor network based on the first capacitor tuning code for a RF transmit operation.

3. The device of claim 1, wherein the processor is further configured to execute processor-executable instructions stored in a non-transitory computer-readable medium to obtain the second capacitor tuning code, establish the second capacitance, and receive the wireless signals.

4. The device of claim 1, wherein the receiver is configured to receive wireless signals at approximately 2.4 gigahertz.

5. The device of claim 1, wherein the processor is further configured to apply the second capacitance to the FBAR using the second capacitor tuning code to shift away from the natural frequency of the FBAR to a frequency between substantially 1 MHz to 2 MHz offset from the transmit frequency.

6. The device of claim 1, wherein the processor is configured to receive wireless signals from the receiver configured by the second capacitor tuning code.

7. The device of claim 1, wherein the capacitor network includes digitally-controlled capacitors, wherein the processor is configured to establish the second capacitance of the capacitor network by enabling one or more of the digitally-controlled capacitors based on the second capacitor tuning code.

8. A device comprising:
a wireless receiver comprising a thin-film bulk acoustic resonator ("FBAR");
a capacitor network conductively coupled to the FBAR, the capacitor network comprising a plurality of capacitors;
a processor in communication with the capacitor network, the processor configured to:
determine a natural frequency of the FBAR;
determine a first capacitance based on the natural frequency of the FBAR and a transmit frequency, the first capacitance between a minimum capacitance and a maximum capacitance establishable by the capacitor network;
determine a second capacitance based on a predetermined offset from the transmit frequency, a difference between the first capacitance and the minimum capacitance, and a difference between the first capacitance and the maximum capacitance;
generate capacitor tuning code based on the second capacitance; and
store the capacitor tuning code.

9. The device of claim 8, further comprising a non-transitory computer-readable medium comprising processor executable instructions, wherein the processor is in communication with the non-transitory computer-readable medium, and the processor is configured to determine the natural frequency, determine the first capacitance, determine the second capacitance, generate the capacitor tuning code, and store the capacitor tuning code by executing the processor executable instructions stored in the non-transitory computer-readable medium.

10. The device of claim 8, wherein the FBAR is included in the wireless receiver, wherein the processor is further configured to:
establish the second capacitance of the capacitor network based on the capacitor tuning code;
apply the second capacitance to the FBAR using the capacitor tuning code to shift away from the natural frequency of the FBAR to a frequency between 1 MHz to 2 MHz offset from the transmit frequency; and
receive a Bluetooth signal.

11. A method comprising:
receiving a capacitor tuning code from a memory device of a wireless device, the wireless device comprising a wireless receiver and a wireless transmitter, the wireless receiver comprising a thin-film bulk acoustic resonator ("FBAR"), the capacitor tuning code configured to establish a capacitance of a capacitor network based on a predetermined offset from a transmit frequency of the wireless transmitter, the capacitor network comprising a plurality of capacitors;
establishing the capacitance of the capacitor network based on the capacitor tuning code; and
shifting, using the capacitor network, a frequency of an electrical signal received from the FBAR to a shifted frequency, the frequency of the electrical signal based on a wireless signal received by the FBAR and having substantially the same frequency used by the wireless transmitter.

12. The method of claim 11, wherein receiving the capacitor tuning code comprises accessing, by a processor, the capacitor tuning code stored in a non-transitory computer-readable medium, wherein establishing the capacitance of the capacitor network comprising applying, by the processor, the capacitor tuning code to the capacitor network.

13. The method of claim 11, wherein the wireless receiver is configured to receive wireless signals at approximately 2.4 gigahertz.

14. The method of claim 11, wherein the shifted frequency is between substantially 1 to 2 MHz offset from the frequency of the wireless transmitter.

15. The method of claim 11, wherein the wireless transmitter of the wireless device comprises the FBAR.

16. A method comprising:
providing a wireless receiver comprising thin-film bulk acoustic resonator ("FBAR");
conductively coupling a capacitor network to the FBAR;
communicatively coupling a processor to the capacitor network;
communicatively coupling a non-transitory computer-readable medium to the processor;
determining a natural frequency of the FBAR;
determining a first capacitance based on the natural frequency and a transmit frequency, the first capacitance between a minimum capacitance and a maximum capacitance;
determining a second capacitance based on a predetermined offset from the transmit frequency, a difference between the first capacitance and the minimum capacitance, and a difference between the first capacitance and the maximum capacitance; and
generating a capacitor tuning code based on the second capacitance; and
storing the capacitor tuning code based on the natural frequency of the FBAR in the non-transitory computer-readable medium.

17. A method comprising:
determining a natural frequency of a thin-film bulk acoustic resonator ("FBAR") included in a wireless device, the wireless device comprising a wireless receiver and a wireless transmitter, the wireless receiver in communication with the FBAR;
determining a first capacitance based on the natural frequency of the FBAR and a transmit frequency of the wireless transmitter, the first capacitance between a minimum capacitance and a maximum capacitance;
determining a second capacitance based on a predetermined offset from the transmit frequency, a difference between the first capacitance and the minimum capacitance, and a difference between the first capacitance and the maximum capacitance;

generating a capacitor tuning code based on the second capacitance; and storing the capacitor tuning code.

18. The method of claim 17, wherein the predetermined offset is between substantially 1 MHz and 2 MHZ and a bandwidth of the FBAR being greater than the predetermined offset, the method further comprising:

applying the second capacitance to the FBAR using the capacitor tuning code to shift a receive frequency of the FBAR to be the predetermined offset from the transmit frequency based on coupling the second capacitance to the FBAR; and receiving, by the wireless receiver, a Bluetooth signal.

19. The method of claim 17, wherein determining the first capacitance comprises:

incrementing an amount of capacitance coupled to the FBAR between the minimum capacitance and the maximum capacitance until the natural frequency of the FBAR is substantially equal to the transmit frequency; and determining the first capacitance is the amount of capacitance.

20. The method of claim 17, further comprising determining the natural frequency of the FBAR, wherein determining the first capacitance comprises:

calculating the difference between the natural frequency and the transmit frequency;

calculating an amount of capacitance to shift the natural frequency of the FBAR to be substantially equal to the transmit frequency; and determining the first capacitance is the amount of capacitance.

21. The method of claim 17, wherein determining the second capacitance comprises determining the second capacitance is closer to the maximum capacitance than the minimum capacitance if the difference between the first capacitance and the maximum capacitance is larger than the difference between the first capacitance and the minimum capacitance or closer to the minimum capacitance than the maximum capacitance if the difference between the first capacitance and the minimum capacitance is larger than the difference between the first capacitance and the maximum capacitance.

22. The device of claim 8, wherein the processor is further configured to determine the second capacitance is closer to the maximum capacitance than the minimum capacitance if the difference between the first capacitance and the maximum capacitance is larger than the difference between the first capacitance and the minimum capacitance or closer to the minimum capacitance than the maximum capacitance if the difference between the first capacitance and the minimum capacitance is larger than the difference between the first capacitance and the maximum capacitance.

* * * * *